United States Patent
Yukawa et al.

(10) Patent No.: US 6,428,393 B1
(45) Date of Patent: Aug. 6, 2002

(54) METHOD OF PROVIDING SEMICONDUCTOR WAFERS EACH HAVING A PLURALITY OF BUMPS EXPOSED FROM ITS RESIN COATING

(75) Inventors: Isao Yukawa; Toshiki Takei, both of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/450,248

(22) Filed: Nov. 29, 1999

(30) Foreign Application Priority Data

Dec. 4, 1998 (JP) .......................................... 10-345201

(51) Int. Cl.[7] ................................................. B24B 1/00
(52) U.S. Cl. .......................................... 451/41; 451/63
(58) Field of Search .............................. 451/41, 58, 63, 451/259, 268

(56) References Cited

U.S. PATENT DOCUMENTS 5,035,087 A * 7/1991 Nishiguchi et al. ........ 51/131.1
5,632,667 A * 5/1997 Earl et al. ...................... 451/41
6,217,433 B1 * 4/2001 Herrman et al. ............. 451/548
6,309,280 B1 * 10/2001 Kaneda et al. ................ 451/41

* cited by examiner

Primary Examiner—Timothy V. Eley
Assistant Examiner—Dung Van Nguyen
(74) Attorney, Agent, or Firm—Rader, Fishman & Grauer, PLLC

(57) ABSTRACT

Disclosed is an improved method of providing semiconductor wafers each having bumps exposed from its resin coating. It uses a rotary wheel having at least one cutter blade formed thereon. The rotary wheel is attached to the spindle of a grinding machine, and a semiconductor wafer having bumps embedded in its resin coating is held on the chuck table of the grinding machine. The rotary wheel is positioned relative to the chuck table so that the cutter blade of the wheel may traverse the center of the chuck table when the wheel is rotated. The chuck table and the wheel are rotated in one and same direction to remove the resin coating from the semiconductor wafer until the bumps may be exposed. Thus, the bumps thus exposed are clear-cut, and coplanar with the surrounding even surface of resin coating.

5 Claims, 5 Drawing Sheets

METHOD OF PROVIDING SEMICONDUCTOR WAFERS EACH HAVING A PLURALITY OF BUMPS EXPOSED FROM ITS RESIN COATING

BACKGROUND OF THE INVENTION

1. Field of the Invention

The present invention relates to a method of providing semiconductor wafers each having a plurality of bumps exposed from its resin coating.

2. Related Arts

Usually a bare chip is mounted to a package having almost same size as the bare chip like a chip size package (abbreviated as CSP), or it is mounted to a printed circuit board as a flip chip. Such a bare chip has bumps formed on its surface for making required electric connections to the electrodes of a package or printed circuit board. Usually the bumps of a bare chip are soldered to selected electrodes in the printed circuit board, and then, the space in which the bump-to-electrode connections are made between the bare chip and the printed circuit board is filled with resin material, thereby fastening the bump-to-electrode connections both to the bare chip and the printed circuit board.

Recently in the semiconductor industry there has been a technical development in which bare chips are formed like CSPs by coating the semiconductor wafers with a resin material. Semi-fabricated products have their bumps embedded in resin material, and therefore, such coating material needs to be removed until the bumps have been exposed.

A grinding wheel having pulverized grindstone fixed on its surface is used in cutting semiconductor wafers of silicon or the like. When such a grinding wheel is used in removing resin coating from the semi-fabricated products, disadvantageously it is likely that the resin coatings become irregular due to plucking or that a burr causes at the edge of the bump. Therefore, it is difficult to provide complete bare chips having clear-cut bumps exposed on their smooth, even resin coatings.

Also, disadvantageously the resin material is so sticky that particle-to-particle spaces in the grinding wheel surface are stuffed with resin debris, thus preventing the grinding wheel from being used continuously.

SUMMARY OF THE INVENTION

One object of the present invention is to provide a method of grinding semi-fabricated semiconductor wafer products having bumps embedded in their resin coatings to remove partly their resin coatings until the underlying bumps have been exposed without causing burrs on the bumps and/or without damaging the surrounding resin coatings due to plucking.

Another object of the present invention is to provide a grinding wheel for use in grinding semi-fabricated semiconductor wafer products having bumps embedded in their resin coatings, which grinding wheel can be used continuously.

To attain these objects a method of providing semiconductor wafers each having a plurality of bumps exposed from its resin coating by using a grinding machine including at least a rotary chuck table for holding a semiconductor wafer having a plurality of bumps embedded in its resin coating and a grinding unit having a rotary wheel held in confronting relation with the rotary chuck table, thereby removing the resin material from the semiconductor wafer until its bumps have been exposed is improved according to the present invention in that: it comprises the steps of: attaching to the grinding unit a rotary wheel having at least one cutter blade formed thereon; holding a semiconductor wafer having a plurality of bumps embedded in its resin coating on the rotary chuck table; positioning the wheel relative to the chuck table so that the cutter blade of the wheel may traverse the center of the chuck table when the wheel is rotated; rotating the chuck table; and rotating the wheel to remove the resin coating from the semiconductor wafer until the bumps have been exposed.

The chuck table and the cutting wheel may be rotated in one and same direction. The rotating speed ratio of the chuck table to the cutting wheel may be 1 to 100 or more. The rotating speed of the cutting wheel may be 3000 or more revolutions per minute whereas the rotating speed of the chuck table may be 10 or less revolutions per minute. The cutter blade may be of diamond or super-hard metal.

A cutting wheel for use in providing semiconductor wafers each having a plurality of bumps exposed from its resin coating is improved according to the present invention in that the cutting wheel has at least one cutter blade on its circumference.

According to the method of grinding semi-fabricated semiconductor wafer and the grinding wheel of the present invention, the resin coatings are removed by grinding with a cutter blade, and therefore it can provide semiconductor wafers having clear-cut bumps in their even resin coating surfaces without causing irregular ends of the resin coatings due to plucking and burrs at the edge of the bumps, thereby increasing quality of the semiconductor wafer.

Further, advantageously the grinding wheels can be used all the time without being stuffed with resin debris, thereby increasing manufacturing efficiency.

Other objects and advantages of the present invention will be understood from the following description of the grinding method and grinding wheel according to preferred embodiments of the present invention, which are shown in accompanying drawings.

DETAILED DESCRIPTION OF PREFERRED EMBODIMENT

Figure 1A:
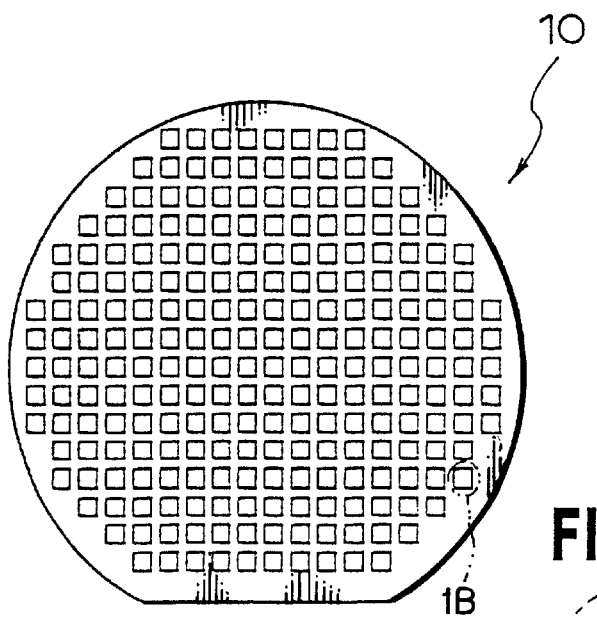
FIG. 1 is a plane view of a semi-fabricated bare chip having bumps embedded in its resin coating.
Figure 1B:
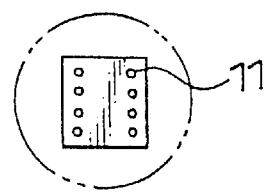
Figure 2:
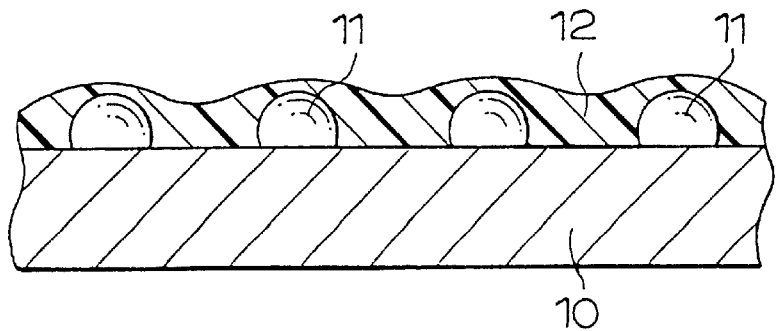
FIG. 2 is a cross section of the semi-fabricated bare chip, showing how bumps are embedded in the resin coating.
Figure 3:
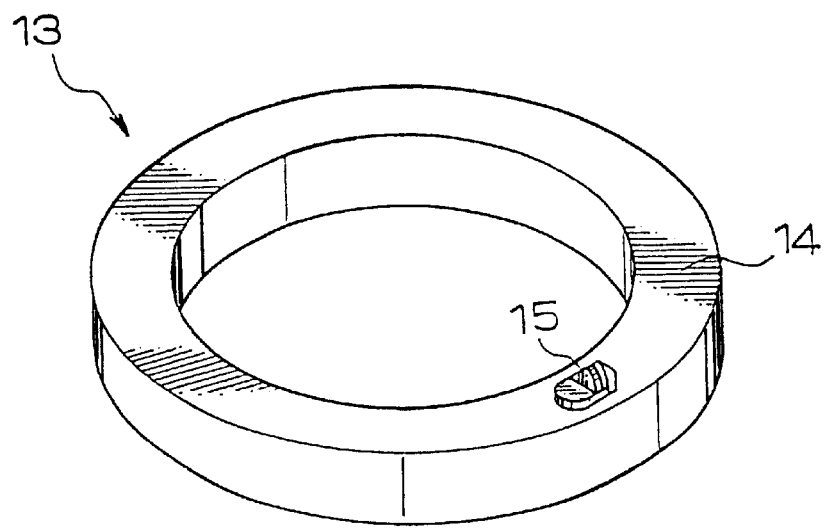
FIG. 3 is a perspective view of one example of grinding wheel for use in grinding semi-fabricated semiconductor wafer products.

Referring to FIG. 1, a semi-fabricated semiconductor wafer 10 has numerous bumps 11 formed on its surface, and these bumps 11 are embedded in the resin coating 12 as seen from FIG. 2. The bumps 11 can be exposed by removing a substantial thickness of resin coating by using one example of grinding wheel 13 according to the present invention as seen from FIG. 3.

The grinding wheel 13 is composed of an aluminum ring 14 having at least one cutter blade 15 formed thereon. The cutter blade 15 is a triangular-pointed piece of diamond or super-hard metal, as shown in FIG. 4.

Figure 5:
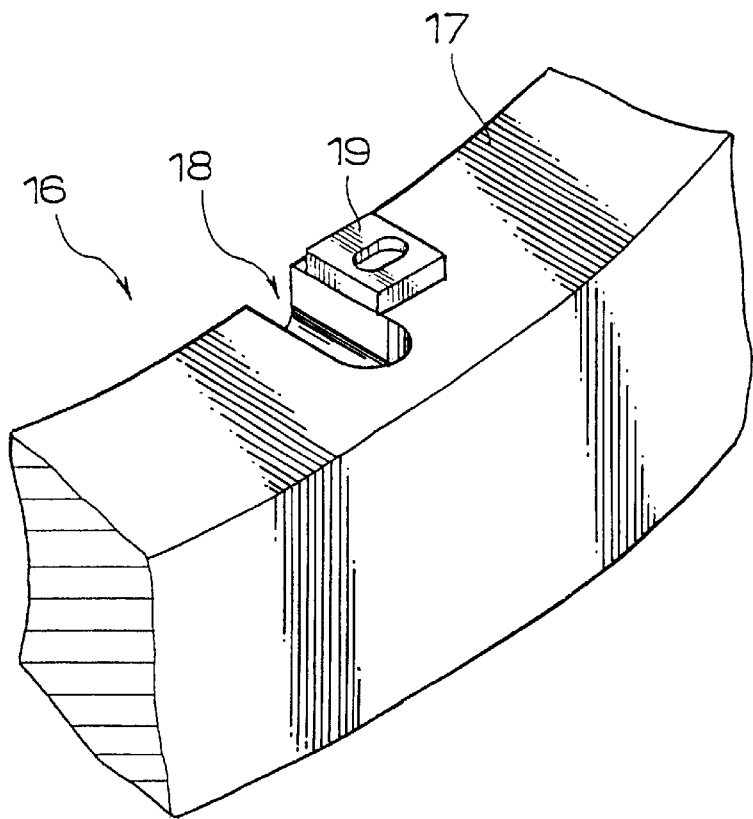
FIG. 5 is an enlarged perspective view of a fragment of another example of grinding wheel, showing the cutter blade formed thereon.

Referring to FIG. 5, another example of grinding wheel 16 is an annular body 17 having at least one recess 18 and a cutter blade 19 formed adjacent to the recess 18. The cutter blade 19 is a super-hard metal piece, which is rectangular, and several millimeters thick.

Figure 6:
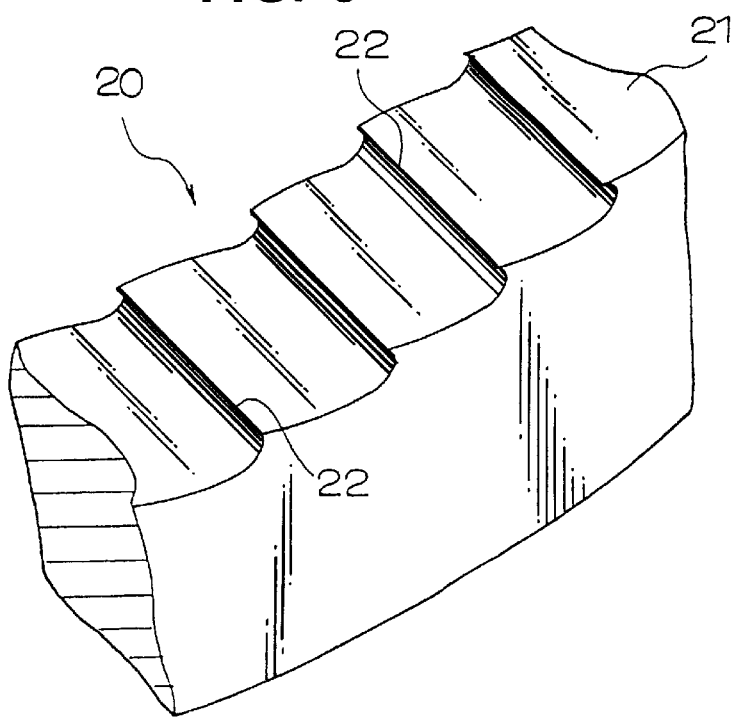
FIG. 6 is an enlarged perspective view of a fragment of still another example of grinding wheel, showing the sawtooth-like cutter blade formed thereon.

Referring to FIG. 6, still another example of grinding wheel 20 is an annular body 21 having sawtooth-like indentations 22 formed thereon. The sawtooth-like indentations are directed in the direction in which the grinding wheel 20 is to be rotated. In this example a plurality of sawtooth-like indentations 22 are formed on the ring body 21, but a single sawtooth-like projection may be formed on the ring body 21. Each sawtooth-like indentation 22 may have pulverized diamond fixed to its edge.

Figure 4:
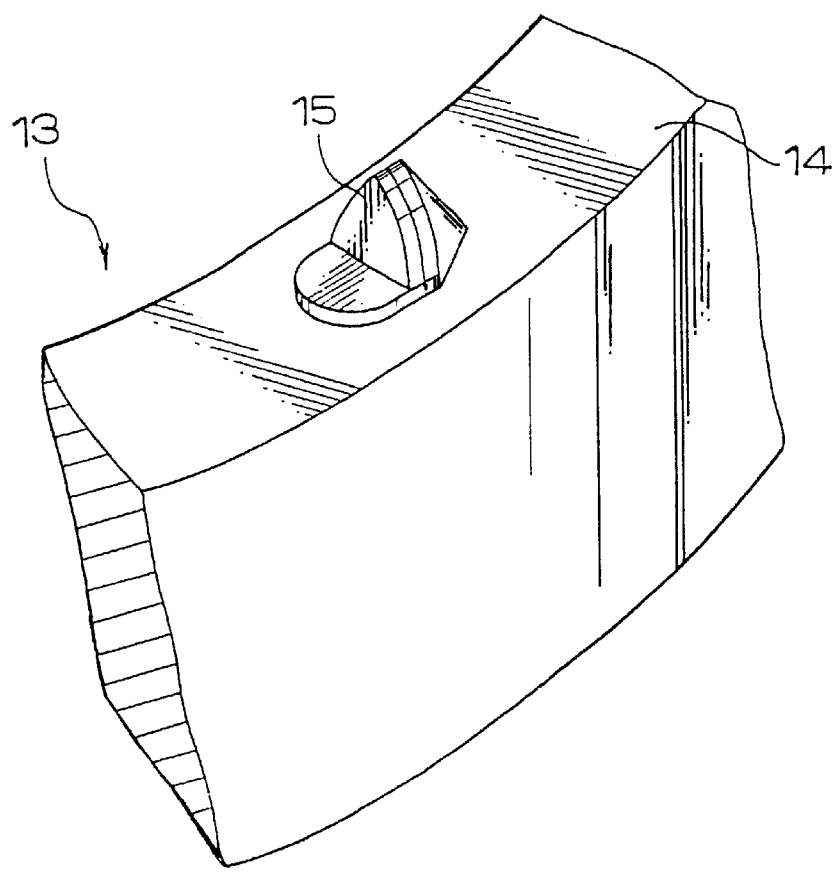
FIG. 4 is an enlarged perspective view of a fragment of the grinding wheel, showing the cutter blade formed thereon.
Figure 7:
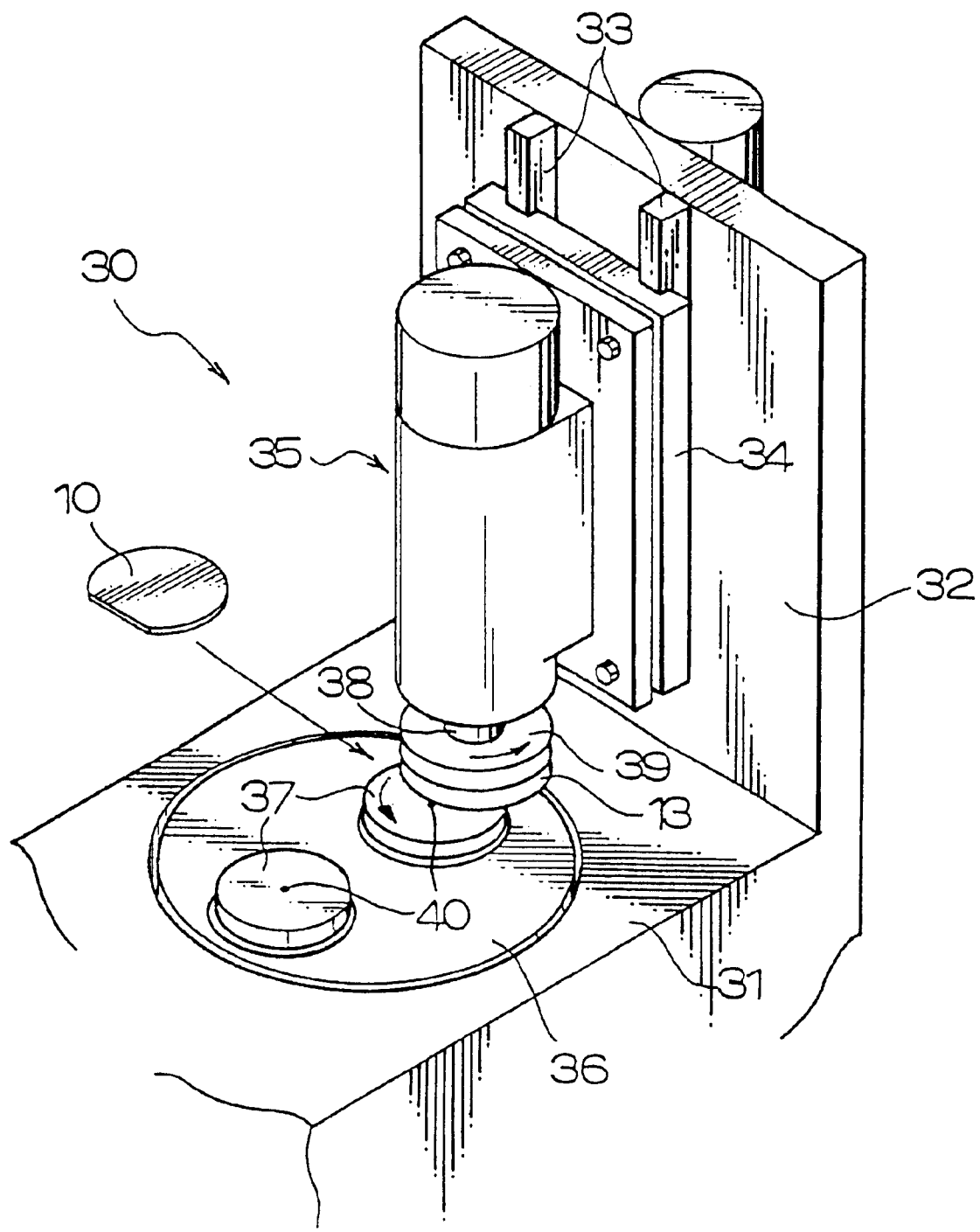
FIG. 7 is a perspective view of a grinding machine for use in grinding semi-fabricated semiconductor wafer products.

When removing the resin coating 12 from the semi-fabricated semiconductor wafer until its bumps 11 have been exposed to be coplanar with the remaining resin coating 12, a grinding wheel such as shown in FIGS. 4, 5 and 6 is attached to the spindle 38 of a grinding machine 30 as shown in FIG. 7.

The grinding method is described as using a grinding wheel 13 (see FIGS. 3 and 4) in the following.

As shown in FIG. 7, a grinding machine 30 comprises a base 31 having an upright wall 32 fixed on one end, a pair of parallel rails 33 laid on the inner surface of the upright wall 32, a slide 34 movably riding on the parallel rails 33, a grinding unit 35 fixed to the slide 34, a turn table 36 rotatably supported on the base 31, and two or more chuck tables 37 for holding semi-fabricated semiconductor wafers 10 thereon.

The grinding unit 35 has a spindle 38 associated therewith, and the spindle 38 has a mount 39 for fixing a grinding wheel 13 with its cutter blade 15 directed downward. Thus, as the spindle 38 is rotated, the grinding wheel 13 rotates.

In removing a substantial thickness of resin coating 12 from the semi-fabricated semiconductor wafer to expose the underlying bumps 11 the wafer is put on the chuck table 37 with its resin coating up, and the turn table 36 is rotated to put the chuck table 37 in confronting position with the grinding wheel 13. The chuck table 37 is rotated about its center, and the grinding unit 35 is lowered while the spindle 38 is rotated about its center axis. Thus, the grinding wheel 13 is rotated and lowered to put its cutter blade 15 in contact with the wafer 10. The grinding unit 35 is lowered gradually, thereby permitting the cutter blade 15 to cut and remove resin material little by little. Finally the underlying bumps 11 are exposed to be coplanar with the resin coating 12.

Figure 8:
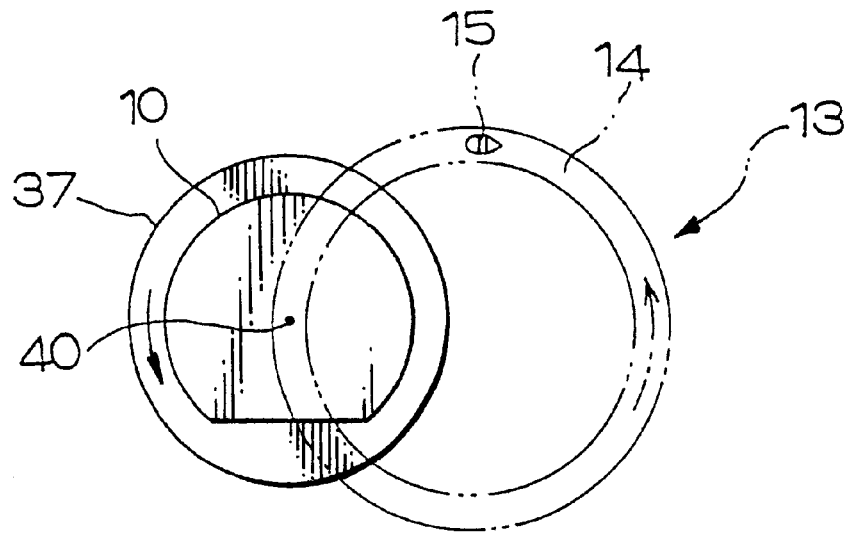
FIG. 8 illustrates how the grinding wheel is positioned relative to the chuck table.
Figure 9:
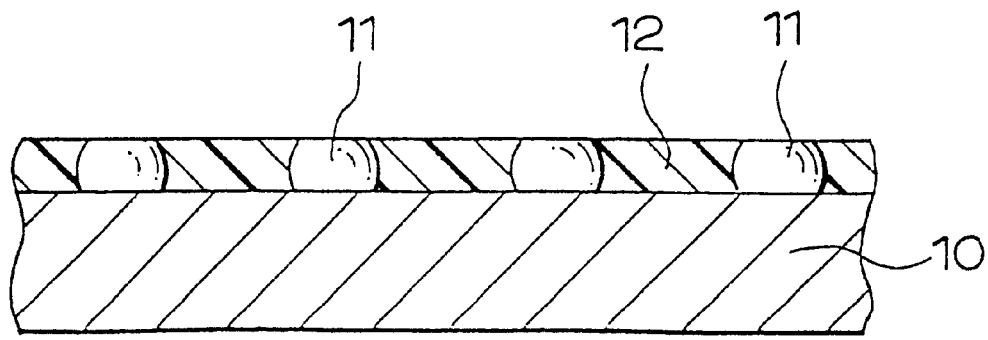
FIG. 9 is a cross section of a semiconductor wafer having bumps exposed to be coplanar with its coating.

Referring to FIG. 8, the grinding wheel 13 is rotated to allow its cutter blade 15 to traverse the center 40 of the chuck table 37. The rotating speed of the chuck table 37 is much slower than that of the grinding wheel 13, preferably 100 or more times smaller. Specifically the chuck table 37 is rotated at the speed of 10 rpm whereas the grinding wheel 13 is rotated at the speed of 3000 rpm. They are rotated in one and same direction. Thanks to the rotating of the grinding wheel 13 about its center the resin coating can be removed evenly.

When the top surfaces of the bumps 11 are exposed to permit the bumps to be connected to selected electrodes of a printed circuit board, the grinding unit 35 is raised, and the chuck table 37 and the grinding wheel 13 are made to stop rotating. Then, the turn table 36 is rotated to bring another chuck table 37 just below the grinding unit 35, confronting with the grinding wheel 13 above the chuck table 37. The same procedure as described above is repeated to remove resin material as much as required for exposing the underlying bumps 11 from the resin coating 12.

The grinding wheels 16 and 20 as shown in FIGS. 5 and 6 can be equally used, providing semiconductor wafers having clear-cut bumps in their even resin coating surfaces. Advantageously the grinding wheels can be used all the time without being stuffed with resin debris, thereby increasing manufacturing efficiency.

What is claimed is:

1. A method of providing semiconductor wafers each having a plurality of bumps exposed from its resin coating by using a grinding machine including at least a rotary chuck table for holding a semiconductor wafer having a plurality of bumps embedded in its resin coating and a grinding unit having a rotary wheel held in confronting relation with the rotary chuck table, thereby removing the resin material from each semiconductor wafer until its bumps have been exposed characterized in that: it comprises the steps of:

attaching to the grinding unit a rotary wheel having at least one cutter blade formed thereon;

holding a semiconductor wafer having a plurality of bumps embedded in its resin coating on the rotary chuck table;

positioning the wheel relative to the chuck table so that the cutter blade of the wheel may traverse the center of the chuck table when the wheel is rotated;

rotating the chuck table; and rotating the wheel to remove the resin coating from the semiconductor wafer until the bumps may be exposed.

2. A method of providing semiconductor wafers each having a plurality of bumps exposed from its resin coating according to claim 1, wherein the chuck table and the cutting wheel are rotated in one and same direction.

3. A method of providing semiconductor wafers each having a plurality of bumps exposed from its resin coating according to claim 2, wherein the rotating speed ratio of the chuck table to the cutting wheel is 1 to 100 or more.

4. A method of providing semiconductor wafers each having a plurality of bumps exposed from its resin coating according to claim 3, wherein the rotating speed of the cutting wheel is 3000 or more revolutions per minute whereas the rotating speed of the chuck table is 10 or less revolutions per minute.

5. A method of providing semiconductor wafers each having a plurality of bumps exposed from its resin coating according to any of claims 1 to 4, wherein the cutter blade is of diamond or super-hard metal.

\* \* \* \* \*

UNITED STATES PATENT AND TRADEMARK OFFICE
CERTIFICATE OF CORRECTION

PATENT NO. : 6,428,393 B1  Page 1 of 1
DATED : August 6, 2002
INVENTOR(S) : Yukawa et al.

It is certified that error appears in the above-identified patent and that said Letters Patent is hereby corrected as shown below:

<u>Title page,</u>
Item [54], Title, should read:
-- [54] Title: METHOD OF PROVIDING SEMICONDUCTOR WAFERS EACH HAVING A PLURALITY OF BUMPS EXPOSED FROM ITS RESIN COATING AND A CUTTING WHEEL --

Signed and Sealed this

Twenty-sixth Day of November, 2002

*Attest:*

*Attesting Officer*

JAMES E. ROGAN
*Director of the United States Patent and Trademark Office*